United States Patent [19]

Earle et al.

[11] Patent Number: 5,422,564
[45] Date of Patent: Jun. 6, 1995

[54] LOW-POWER PORTABLE CIRCUIT BREAKER(S) LOCATOR

[75] Inventors: Kent L. Earle, Woodridge; Joseph A. Rocci, Burr Ridge, both of Ill.

[73] Assignee: Etcon Corporation, Burr Ridge, Ill.

[21] Appl. No.: 795,189

[22] Filed: Nov. 18, 1991

[51] Int. Cl.[6] .................... G01R 31/04; G01R 31/28; H04B 3/46

[52] U.S. Cl. .................... 324/67; 324/326; 324/424; 324/529; 324/543

[58] Field of Search ................ 324/66, 67, 326, 424, 324/508, 512, 520, 527, 528, 529, 537, 538, 539, 542, 555

[56] References Cited

U.S. PATENT DOCUMENTS

| | | | |
|---|---|---|---|
| 1,900,424 | 3/1933 | Woodbury | 324/66 |
| 3,906,504 | 9/1975 | Guster et al. | 324/326 X |
| 3,982,181 | 9/1976 | Ferony et al. | 324/67 X |
| 4,095,212 | 6/1978 | Pruitt | 324/508 X |
| 4,642,556 | 2/1987 | Pecukonis | 324/67 |
| 4,748,402 | 5/1988 | Sellati | 324/66 |
| 4,801,868 | 1/1989 | Brooks | 324/508 X |
| 4,937,519 | 6/1990 | Fields, III | 324/66 |
| 5,065,098 | 11/1991 | Salsman et al. | 324/67 X |
| 5,264,795 | 11/1993 | Rider | 324/326 |
| 5,296,850 | 3/1994 | King | 324/66 X |

*Primary Examiner*—Sandra L. O'Shea
*Assistant Examiner*—Warren S. Edmonds
*Attorney, Agent, or Firm*—Allegretti & Witcoff, Ltd.

[57] ABSTRACT

This invention permits one to trace more than one electrical conductor, each of the electrical conductors being associated with both a circuit breaker and an electrical outlet. The invention consists of a receiver and multiple transmitters. Further, in a single transmitter form of the invention, the invention permits the transmitter to continually transmit its signature signal without power dissipation concerns, just like the ability to continually transmit in the multiple transmitter form of the invention. Lastly, the device is able to trace conductors regardless of the load electrically connected to the conductor.

4 Claims, 13 Drawing Sheets

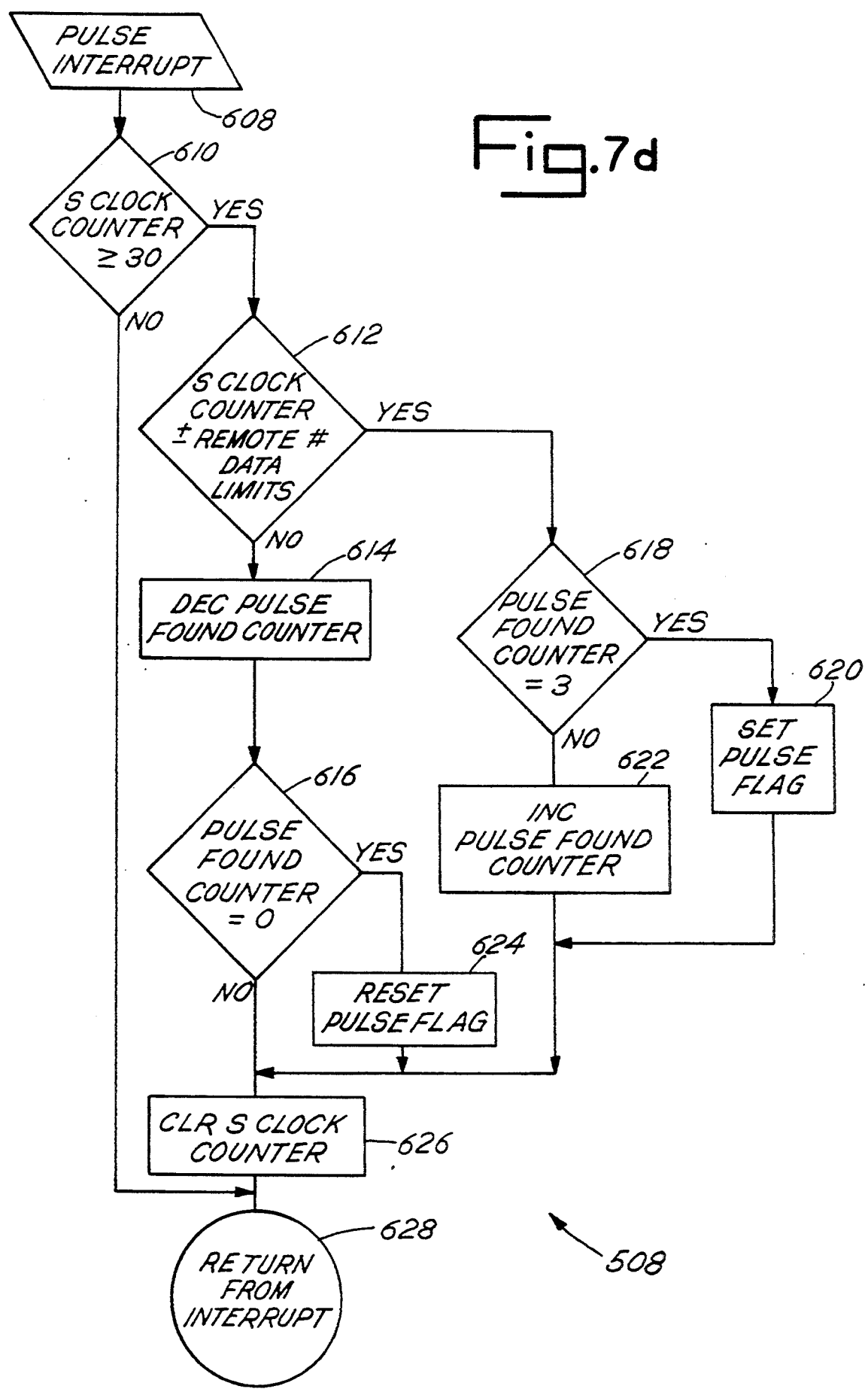

LOW-POWER PORTABLE CIRCUIT BREAKER(S) LOCATOR

FIELD OF THE INVENTION

The present invention relates to new and improved devices for tracing conductors capable of conducting electricity. More specifically, the present invention relates to the identification of a particular circuit breaker associated with an electrical outlet.

BACKGROUND OF THE INVENTION

It is often necessary, for various reasons, to determine which circuit breaker in a circuit breaker box, controls the flow of current to a given electrical outlet. The process of determining which circuit breaker is associated with a given outlet is quite time consuming. For instance, many people simply take a lamp and plug it into the electrical outlet that they desire to check. They then walk to the circuit breaker box and open the first circuit breaker. They then walk back to the lamp and see if it is still illuminated. If the lamp is illuminated, the person knows that the first circuit breaker does not correspond to the electrical outlet where the lamp is plugged in. If the lamp is not illuminated, the person has identified the circuit breaker corresponding to that particular outlet where the lamp is plugged in. By using this method, a person must often make numerous trips between the circuit breaker box and the desired electrical outlet, consuming much time. A further disadvantage of this method is its obvious shortcomings in a hospital setting, for instance where artificial respirators are used.

To overcome these disadvantages, the prior art developed a line tester comprising a receiver and a transmitter. An example of such a line tester is disclosed in U.S. Pat. No. 4,642,556. Essentially, the line tester has a receiver and a transmitter. The transmitter is plugged into the electrical outlet the operator desires to check. The transmitter sends current pulses along the electrical conductor, the electrical conductor terminating at the circuit breaker box. The operator walks to the circuit breaker box and waves a wand-like receiver in close proximity to the circuit breaker box. The receiver has a sensing coil. The transmitter's current pulse generates a signal in the sensing coil when the receiver is close enough to the controlling circuit breaker of the desired electrical outlet. The signal is amplified and the receiver, via indicators, notifies the operator that the receiver is in close proximity to the circuit breaker corresponding to the electrical outlet where the transmitter is plugged in.

However, the above-described line testers have many disadvantages. First, the above-described units have been effective is sensing conductors in electrical connection with resistive loads or computer apparatus, but not both. Second, the operator must walk from the circuit breaker back to the old electrical outlet, then to a new electrical outlet and finally back to the circuit breaker box in order to test a second electrical outlet. If many electrical outlets need testing, this method is quite time consuming. Third, previous transmitters place a resistive load in series with the conductor. Therefore, due to power dissipation considerations, the transmitters do not continually transmit and instead transmit current pulses in pre-determined duty cycles.

Accordingly, it is a primary object of the present invention to provide a circuit breaker tester with multiple transmitters.

Another object of the present invention is to provide a circuit breaker tester whose transmitters can continuously transmit signature signals.

Yet another object of the present invention is to provide a device that functions effectively regardless of the load electrically connected to the conductor (e.g. the present device performs resistive-sensing and computer-sensing equally as well).

SUMMARY OF THE INVENTION

It has been discovered that a preferred form of the present invention is useful in a circuit breaker tester including a plurality of transmitters and a receiver. Each of the plurality of transmitters generates a distinct "signature signal." Each signature signal is carried along a conductor, there being a conductor for each transmitter. The conductors are comprised of the wiring in between an electrical outlet and a circuit breaker box.

The receiver of the circuit breaker tester is comprised of sensing means, processing means, and indicator means. The sensing means is comprised of a coil. The processing means, which is connected to the sensing means, is comprised of wave-shaping electronics, noise reduction electronics, and a micro-processor with associated circuitry. The indicator means, which is electrically connected to the processing means, is comprised of LCD's. The receiver also contains its own power supply, which is simply comprised of some batteries.

Essentially, the circuit breaker tester functions as follows. First, the plurality of transmitters are plugged into various electrical outlets. Second, each transmitter uses the line voltage to generate a distinct signature signal which is carried along the transmitter's respective conductor. These signature signals are present on the conductors from the electrical outlet to the circuit breaker box. Third, the receiver is enabled to detect a particular signature signal. Fourth, the receiver is placed in close proximity to the circuit breakers whereby the coil, or transducer, detects an electromagnetic field due to the pre-selected signature signal. Fifth, the signal in the coil of the receiver undergoes amplification, wave-shaping, noise reduction, and processing that results in energization of the indicator means. When the indicator means is energized (i.e., illuminated) to the greatest extent, the circuit breaker closest to the receiver corresponds to the circuit breaker that controls power to the electrical outlet of the pre-selected transmitter.

It has been discovered that another form of the present invention includes only one transmitter. A one transmitter circuit breaker tester still allows for continuous transmission of a signature signal. The transmitter places a capacitor is series with the conductor to be tested. Transmitters in the multiple transmitter configuration do this also. Since the capacitor acts as a reactive load, essentially no power is consumed by this section of the transmitter. Further, the one transmitter circuit breaker tester is also useful for both computer apparatus and resistive loads that are electrically connected to the conductors.

BRIEF DESCRIPTION OF THE DRAWINGS

The above embodiments and other objects, advantages, and features of the invention will hereinafter appear for purposes of illustration, but not of limitation, in connection with the accompanying drawings in which like numbers refer to like parts throughout and in which:

FIG. 6a is an electrical schematic diagram showing a preferred form of the receiver shown in FIG. 5a; FIGS. 7a–7e are parts of the block of the software used in the receiver's microprocessor, as shown in FIGS. 5b and 6b.

DETAILED DESCRIPTION OF THE PREFERRED EMBODIMENTS

Figure 1:
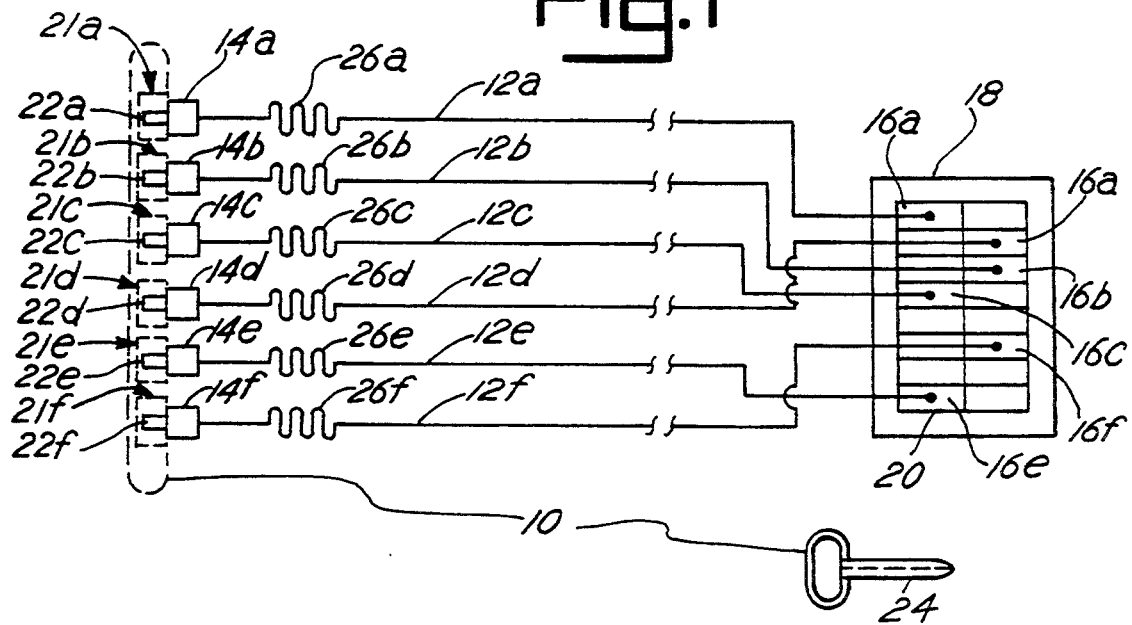
FIG. 1 is a block diagram of the multiple transmitter circuit breaker tester system.

Referring to FIG. 1, a preferred form of the present invention can be used to identify one of a plurality of circuit breakers that corresponds to an electrical outlet. The circuit breaker tester, 10, is able to identify circuit breakers corresponding to six different conductors, 12a–12f, connected between six electrical outlets, 14a–14f, and six circuit breakers 16a–16f that are housed in a remote circuit breaker box 18 having a plurality of circuit breakers 20, with only one trip to the circuit breaker box 18. The circuit breaker tester 10 is comprised of no more than six transmitter means, 21a–21f, and a receiver means, 24. Each transmitter means 21a–21f is comprised of a transmitter, 22a–22f. Each transmitter 22a–22f generates a distinctive signature signal, 26a–26f, respectively, that is detectable by the receiver means 24. For the sake of simplicity, the remaining description will be limited to transmitter 22a, conductor 12a, signature signal 26a, circuit breaker box 18, and receiver means 24, unless otherwise noted.

Figure 2:
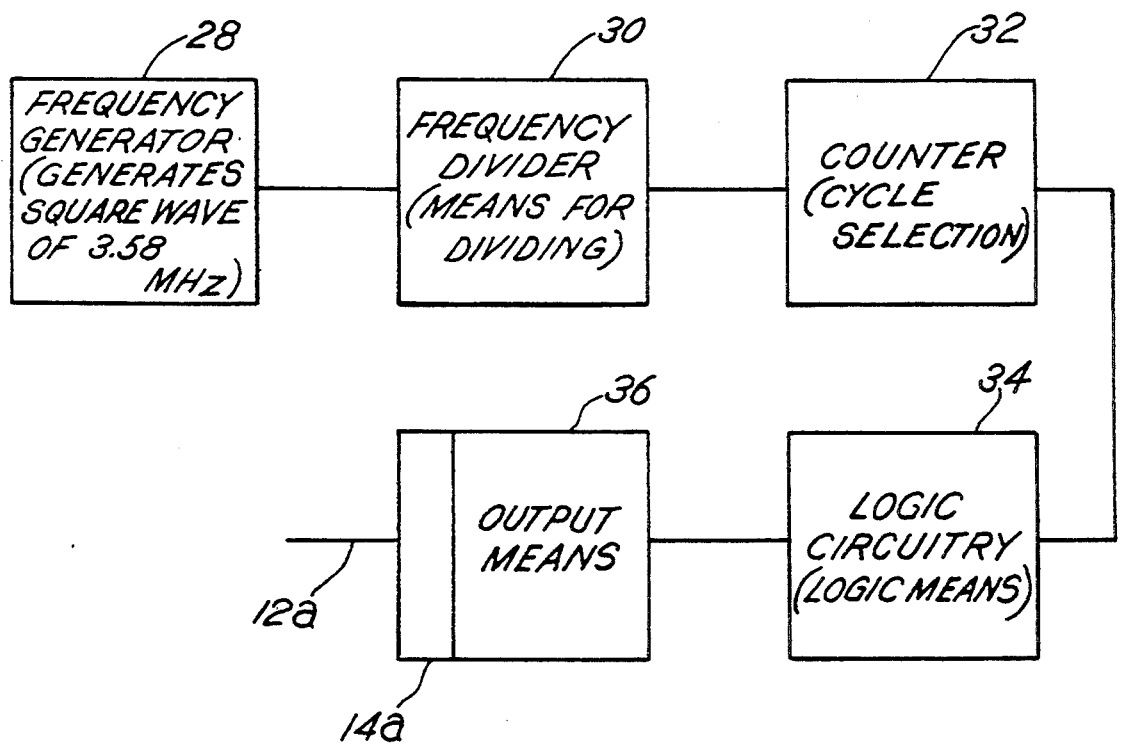
FIG. 2 is a block diagram of a transmitter.

Referring to FIG. 2, the block diagram of the transmitter 22a is comprised of means for generating an oscillating signal of a preselected frequency 28 (e.g., an oscillator), means for dividing 30 (e.g., a frequency divider), means for cycle selection (e.g., a counter) 32, logic means (e.g., circuitry) 34 and output means 36, all connected as shown. Although only one transmitter 22a is described, those of ordinary skill in the art know that the frequency divider 30 can be hard-wired in numerous configurations that produce different frequency outputs. The different frequencies are used to generate the different signature signals, 26a through 26f, of the transmitters, 22a through 22f.

Figure 4:
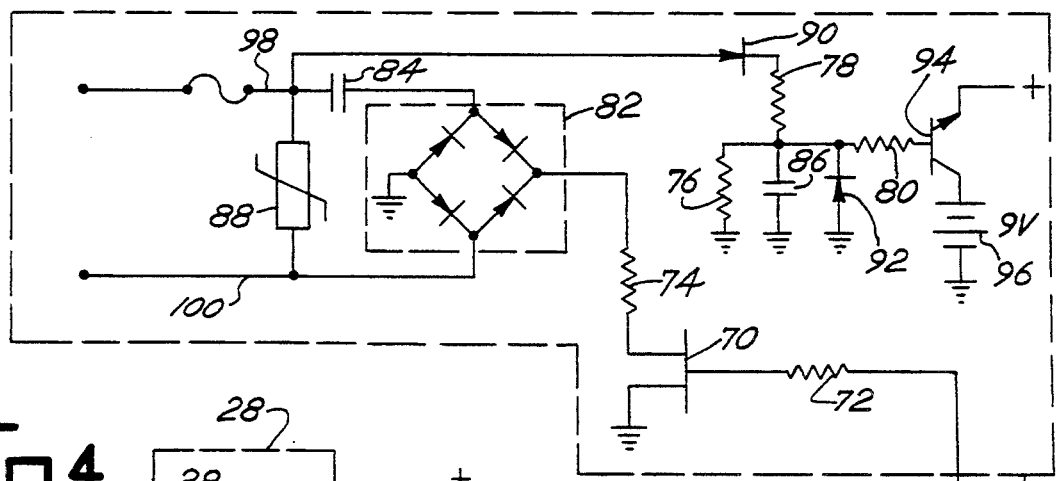
FIG. 4 is an electrical schematic diagram showing a preferred form of the transmitter made in accordance with the present invention.

Referring to FIG. 4, the oscillator 28 is further comprised of a 3.58 MHz crystal 38, resistors 40 and 42, and NAND gate 44 connected as shown. The output of NAND gate 44 is a zero to nine volt square wave at a frequency of 3.58 MHz. The output of the NAND gate 44 is input into the frequency divider 30, preferably a 4569 manufactured by Motorola. The output of the frequency divider is input into the counter 32, preferable a 4040 manufactured by Motorola, that serves as divide by two and divide by eight circuitry.

Still referring to FIG. 4, the frequency divider 30 outputs, via pin 1, either two times $f_{high}$ or two times $f_{low}$ to the counter 32, $f_{high}$ and $f_{low}$ being frequencies corresponding to about the higher and lower 3 dB points of the center frequency of the receiver means 24. The center frequency of receiver means 24 is about 19.2 KHz. Once two times $f_{high}$ or two times $f_{low}$ is received at pin 10 of the counter 32, the frequency is divided by both two and eight. Division by two results in a frequency of either $f_{high}$ or $f_{low}$. Division by eight results in a frequency of either $f_{high}/4$ or $f_{low}/4$.

Figure 4A:
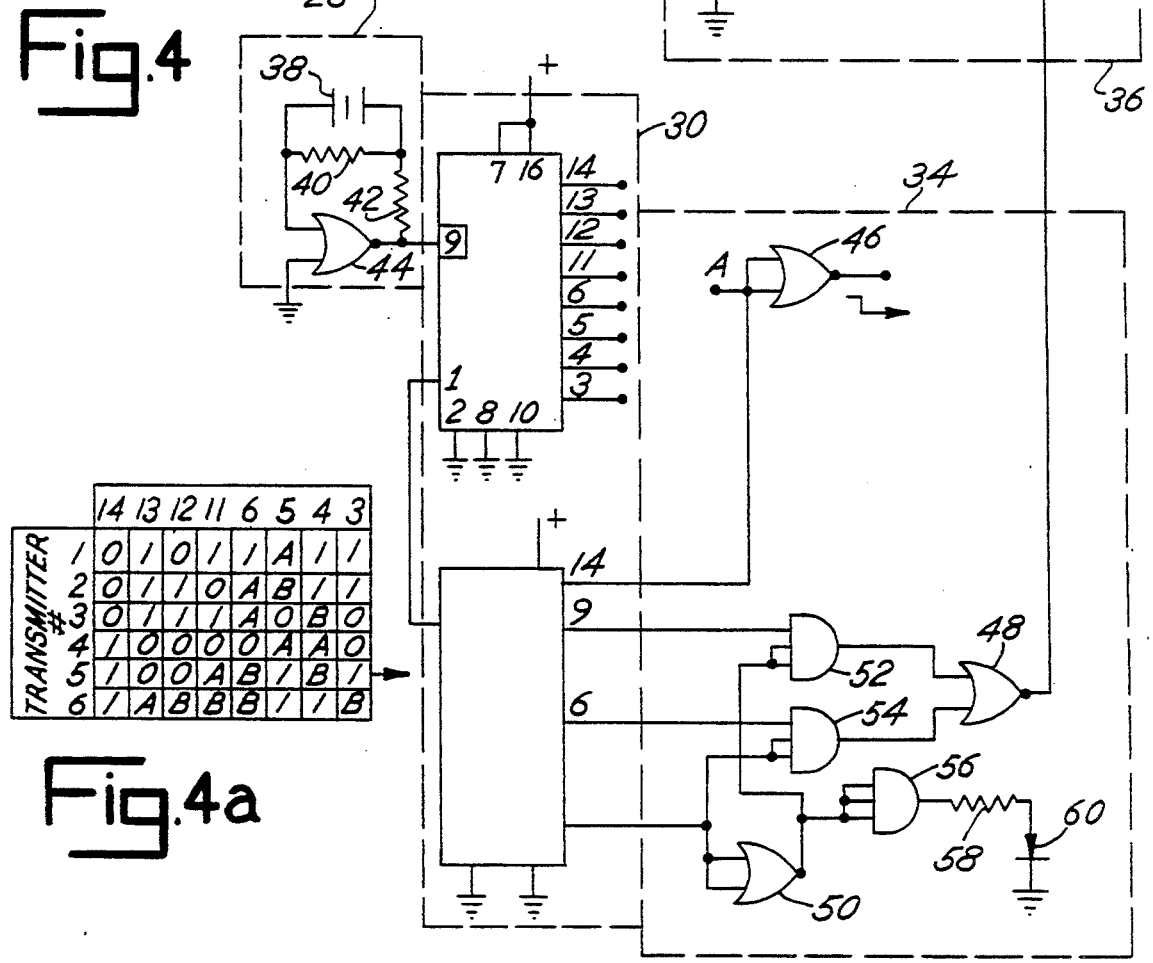
FIG. 4a is a connection table for up to 6 transmitters used in FIG. 4.

Again referring to FIG. 4, the logic circuitry 34 is comprised of NOR gates 46, 48, and 50, AND gates 52, 54, and 56, resistor 58 and LED 60 all connected as shown. NOR gate 46 determines whether the frequency divider 30 outputs two times $f_{high}$ or two times $f_{low}$. The output of frequency divider 30 starts by outputting two times $f_{high}$. In this state, point A of NOR gate 46 is low and point B of NOR gate 46 is high. The output frequency of two times $f_{high}$ continues for 1024 cycles of $f_{high}$ (about 0.025 seconds). After 1024 cycles, point A goes high and point B goes low. Immediately, frequency divider 30 begins to output two times $f_{low}$. This frequency is transmitted until a 1024 cycles of $f_{low}$ have elapsed (also about 0.025 seconds) at which time the frequency divider 30 begins to output two times $f_{high}$ and the above-described cycle starts again. The connections of frequency divider 32 to points A and B of NOR gate 46 are shown in FIG. 4(a) for the multiple transmitter unit (up to six transmitters). For the single transmitter configuration, pins 14, 11, 6, 4, and 3 are grounded and pins 13, 12, and 5 are connected to nine volts.

The counter 32 takes the input of two times $f_{high}$ or two times $f_{low}$ and divides the frequency by two and eight, resulting in $f_{high}$ or $f_{low}$, which is output on pin 9, and $f_{high}/4$ or $f_{low}/4$, which is output on pin 6. Output pin 1 of the counter 32 is low for the first 4096 cycles of $f_{high}$ (about 0.1 seconds). This corresponds to mode 1, namely the transmission of $f_{high}$ or $f_{low}$. Output pin 1 then goes high for the next 4096 cycles of $f_{high}$ (about 0.1 seconds). This corresponds to mode 2, namely the transmission of $f_{high}/4$ or $f_{low}/4$. The frequencies $f_{high}$, $f_{low}$, $f_{high}/4$ and $f_{low}/4$ comprise the signature signal 26a of transmitter 22a. However, the exact composition of the signature signal 26a, and how it is formed, can be more easily understood by reference to FIGS. 3(a) through 3(f) which are not drawn to scale.

Figure 3A:
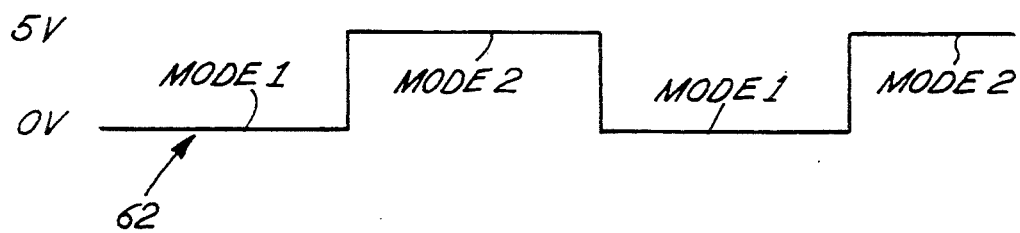
FIGS. 3a–3f are diagrams of the signature signals.
Figure 3B:
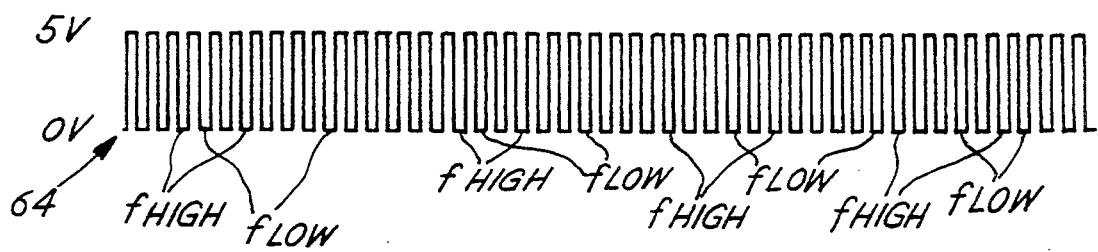
Figure 3C:
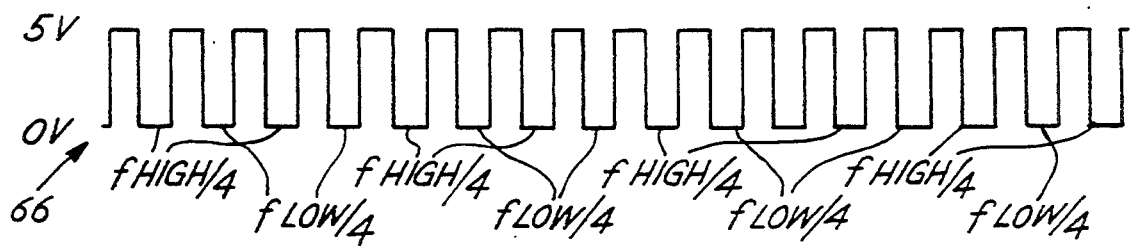
Figure 3D:
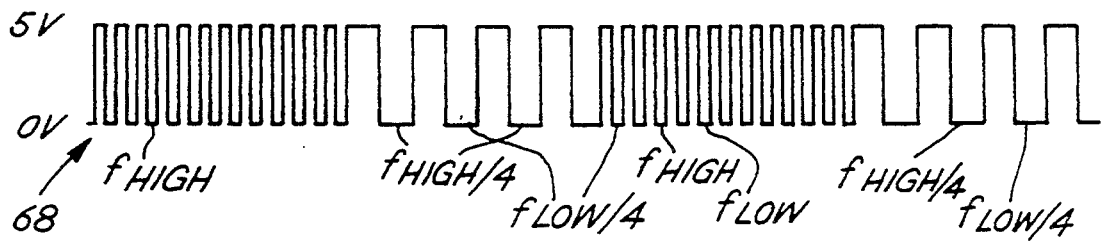

FIG. 3(a) shows the mode selection signal 62 present on pin 1 of the counter 32. FIG. 3(b) shows the mode 1 signal 64 present on pin 9 of the counter 32. FIG. 3(c) shows the mode 2 signal 66 present on pin 6 of the counter 32. FIG. 3(d) shows how the logic circuitry 34 combined mode selection signal 62, mode 1 signal 64 and mode 2 signal 66 to form a signal 68 (see FIG. 3(d)) that is present at the output of NOR gate 48 and is converted, via output means 36, into signature signal 26a.

Referring to FIG. 3(a), output pin 1 switches from mode 1 (low) to mode 2 (high), and vice versa, every 4096 cycles of $f_{high}$. Thus, the logic circuitry 34 outputs, via NOR gate 48, a signal of about 5 Hz. The first half of the 5 Hz signal is used to output mode 1 signals ($f_{high}$ and $f_{low}$). More specifically, referring to FIG. 3(b), NOR gate 48 outputs $f_{high}$ for the first and third quarters of mode 1 (each quarter being about 1024 cycles of $f_{high}$)

and $f_{low}$ for the second and fourth quarters of mode 1. The second half of the 5 Hz signal is used to output mode 2 signals ($f_{high}/4$ and $f_{low}/4$). More specifically, referring to FIG. 3(c), NOR gate 48 outputs $f_{high}/4$ for the first and third quarters of mode 2 and $f_{low}/4$ for the second and fourth quarters of mode 2. The signals shown in FIGS. 3(a) through 3(c) are combined, via AND gates 52 and 54 and NOR gates 50 and 48, to form signal 68 at the output of NOR gate 48 as shown in FIG. 3(d). It is obvious to those of ordinary skill in the art how the signals of FIGS. 3(a) through 3(c) are combined to form the signal 68 of FIG. 3(d). The signal from NOR gate 50 is also used, in conjunction with AND gate 56 and resistor 58, to illuminate LED 60 when transmitter 22a is transmitting.

Mode 1 is most effective when one is trying to trace a conductor that is electrically connected to a resistive load. Mode 2 is most effective when one is trying to trace a conductor that is electrically connected to computer apparatus.

Referring once again to FIG. 4, signal 68 from the output of NOR gate 48 of logic circuitry 34 is input into the output means 36 of transmitter 22a. The output means 36 is comprised of FET transistor 70, resistors 72, 74, 76, 78 and 80, rectifying means 82, capacitors 84 and 86, metal oxide varistor 88, diodes 90 and 92, n-p-n transistor 94, and battery 96 connected as shown. Also, FIG. 4 shows hot wire 98 and neutral wire 100, which comprise the conductor to be traced, in relationship to the transmitter 22a. Transistor 70 operates as a switch that switches at a frequency of either $f_{high}$, $f_{low}$, $f_{high}/4$, or $f_{low}/4$, depending upon the frequency emanating from the output of NOR gate 48.

Figure 3E:
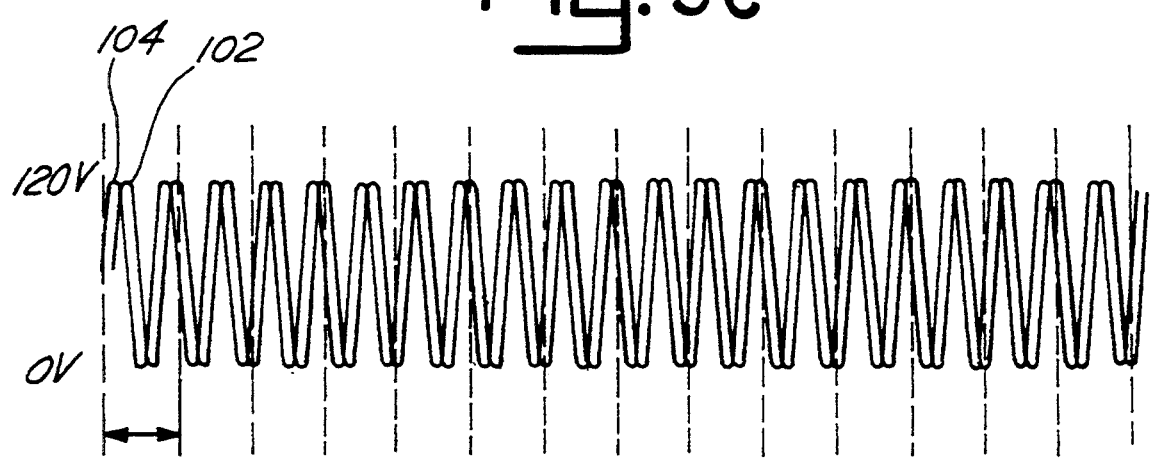
Figure 3F:
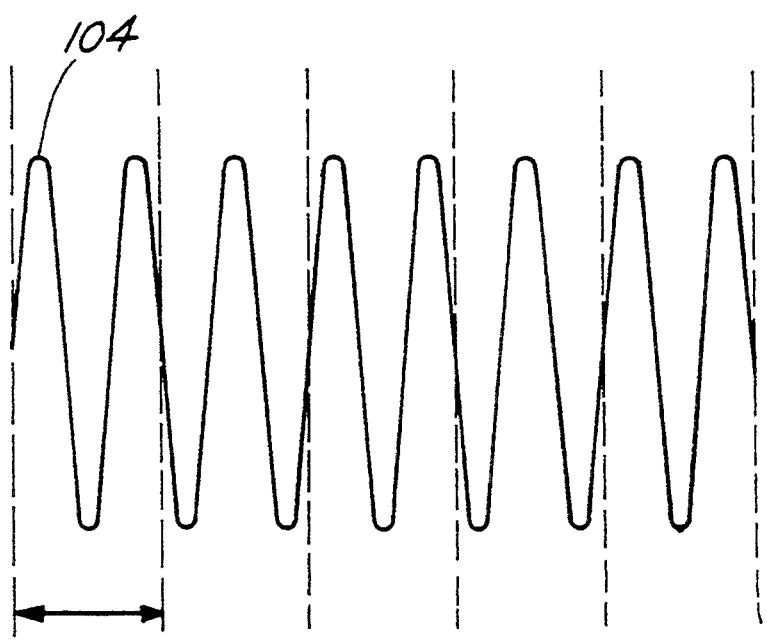

Referring again to FIG. 3 and FIG. 4, without transmitter 22a plugged into an electrical outlet 14a (see FIG. 1), the voltage across conductors 98 and 100 is shown in FIG. 3(e) (120 volts AC at 60 Hz). However, once transmitter 22a is plugged into electrical outlet 14a, current can flow from conductor 98 to conductor 100. Capacitor 84, preferably a 2 microfarad capacitor, serves as a means for phase shifting and ensures that the current is 90 degrees out of phase from the voltage. Since the capacitor 84 does not consume power, the transmitter 22a can continually transmit its signature signal 26a instead a using a duty cycle to transmit its signature signal 26a. FIG. 3(e) shows the voltage signal 102 across conductors 98 and 100 and the current signal 104 being carried by conductors 98 and 100. The current signal 104 is the same as the signature signal 26a of transmitter 22a. The signature signal 26a, or current signal 104, is bounded by a 60 Hz envelope 106. Since the frequency of the mode selection signal 62 of FIG. 3(a) is about 5 Hz, twelve cycles of the 60 Hz envelope 106 elapse in the same amount of time as one cycle of the mode selection signal 62. These twelve 60 Hz cycle comprise in the following order, 1.5 cycles of $f_{high}$, 1.5 cycles of $f_{low}$, 1.5 cycles of $f_{high}$, 1.5 cycles of $f_{low}$, 1.5 cycles of $f_{high}/4$, 1.5 cycles of $f_{low}/4$, 1.5 cycles of $f_{high}/4$, and 1.5 cycles of $f_{low}/4$. This is shown in detail in FIG. 3(f). Although the transmitter 22a has been described with respect to specific values for $f_{high}$, $f_{low}$, $f_{high}/4$, and $f_{low}/4$, those of ordinary skill in the art know that the other five transmitters, 22b through 22f, use different frequencies that are attainable by varying connections made to the frequency divider 30 (see FIG. 4(a)). Further, it will be apparent to those of ordinary skill in the art that current pulses, with frequencies of $f_{high}$, $f_{low}$, $f_{high}/4$, and $f_{low}/4$, comprising signature signal 26a are capable of inducing an electrical signal in a sensing means 108 (see FIG. 5b) provided that the sensing means 108 is in close proximity to the conductor 12a carrying the signature signal 26a. The induced signal 110 (see FIG. 5b) is the cornerstone of operation of the receiver means 24.

Figure 5A:
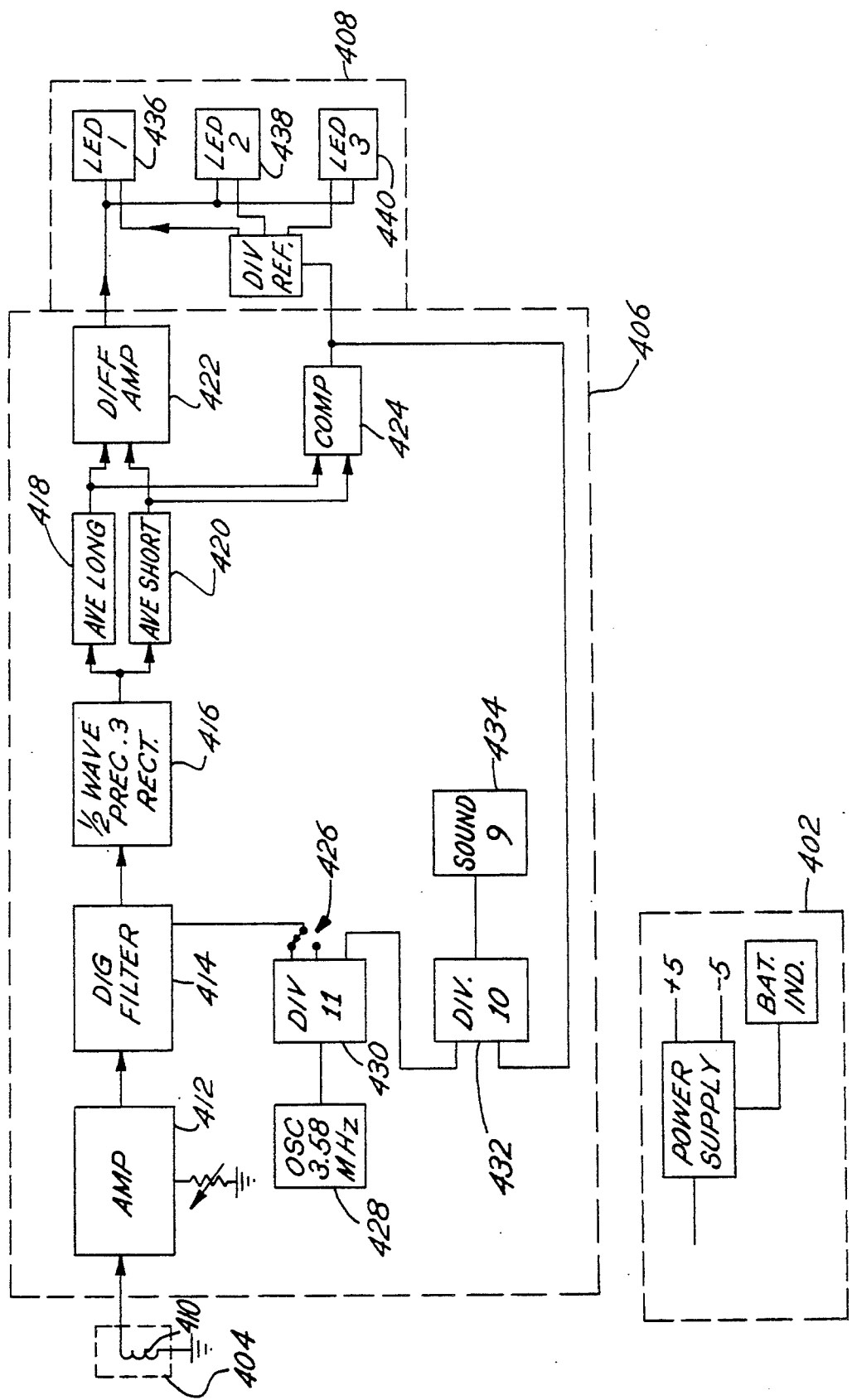
FIG. 5a as a block diagram of the receiver made in accordance with the single transmitter embodiment of the present invention.
Figure 5B:
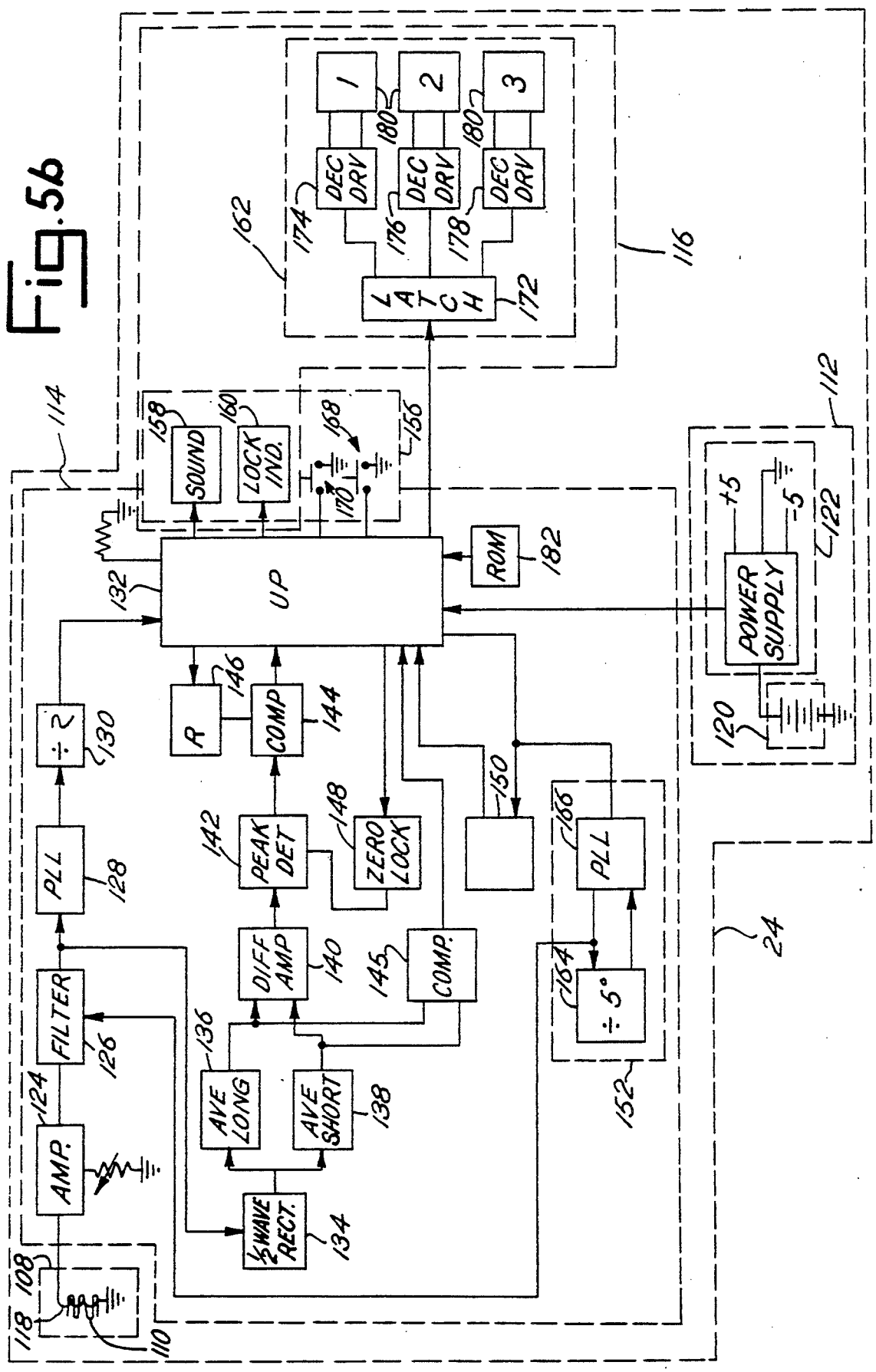
FIG. 5b is a block diagram of the receiver made in accordance with the multiple transmitter embodiment of the present invention.

Referring to FIG. 5b, receiver means 24 is comprised of power means 112, sensing means 108, processing means 114, and indicator means 116. Preferably, the sensing means 108 is comprised of a transducer 118. Preferably, the power means 112 is comprised of two nine volt batteries 120 and power regulation means 122 connected as shown. Preferably, the processing means 114 is comprised of amplifier means 124, filter means 126, phase locked loop 128, frequency divider 130 (preferably model no. 4040 manufactured by Motorola as shown in FIG. 6b), microprocessor 132, half wave rectifier 134, averaging circuitry 136 and 138, differential amplifier 140, peak detector 142, comparitors 144 and 145, ramp circuitry 146, locking circuitry 148, frequency divider 150, synthesizer 152, oscillator 154 (which is comprised of 12 MHz crystal 316 and capacitors 316 and 320, all shown in FIG. 6(b)), and selection circuitry 156 all connected as shown. Preferably, the indicator means 116 is comprised of audio indicator means 158, coarse visual indicator means 160 for indicating the detection of the signature signal 26a, and strength indicator means 162 for indicating the strength of the signature signal 26a detected all connected as shown.

Again referring to FIG. 5b, synthesizer 152 is comprised of frequency divider 164 and phase locked loop 166 connected as shown. Further, selection circuitry 156 is comprised of mode selection circuitry 168 and transmitter selection circuitry 170 connected as shown. Strength indicator means 162 is comprised of latch 172, LED drivers 174, 176, and 178, and LEDs 180 connected as shown. Microprocessor 132, an 86C91 Zilog microprocessor, contains a ROM 182 that executes a software program 184 (see FIG. 7).

Referring to FIG. 6b, which shows a detailed preferred embodiment of the receiver 24, the amplifier means 124, which is connected to sensing means 108, is comprised of resistors 186, 188, 190, 192, 194, 196, and 198, capacitors 200 and 202, diodes 204 and 206, and amplifiers 208 and 210 connected as shown. Resistor 190 is a variable resistor that is used to adjust the sensitivity of amplifier 208 which is a useful feature when the conductor 12a to be traced could terminate in a variety of different circuit breaker boxes, e.g., 18. The amplifier means 124 amplifies the induced signal 110 (see FIG. 5b) generated in the sensing means 108 by the signature signal 26a.

Again referring to FIG. 6b, the filter means 126 receives the output of the amplifier means 124 and smoothes out the amplified induced signal 110. The filter means comprises, in its preferred form, integrated circuit model no. MF10CN 212 manufactured by National Semiconductor and resistors 214, 216, 218, 220, 222, and 224 connected as shown. The output of the filter means 126 is fed into phase locked loop 128 and half wave rectifier 134 as shown.

Again referring to FIG. 6b, phase locked loop 128 is comprised of integrated circuit model no. 4046 226 manufactured by Motorola, resistors 228, 230, 232, and 234, and capacitors 236 and 238 connected as shown. The phase locked loop 128 essentially serves to convert the filtered analog signal into a square wave. In circuit breaker tester 10 using multiple transmitters, e.g., 22a through 22f, the phase locked loop 128 should have a large enough bandwidth to be able to detect $f_{high}$ and $f_{low}$ for each transmitter.

Again referring to FIG. 6b, the half wave rectifier 134 is comprised of amplifier 240, resistors 242, 244, and 246, diodes 248 and 250, and capacitor 252 connected as shown. Averaging circuitry 136 is comprised of resistor 254 and capacitor 256 connected as shown. Averaging circuitry 138 is comprised of resistor 258 and capacitor 260 connected as shown. Differential amplifier 140 is comprised of amplifier 262 and resistors 264, 266, 268, 270 and 272 connected as shown. The half wave rectifier 134, averaging circuitry 136 and 138, and the differential amplifier 140, when connected as shown, help reduce noise on the amplified, filtered induced signal 110.

Again referring to FIG. 6b, the output of the differential amplifier 140 is fed into the peak detector 142 that is comprised of amplifier 274, resistors 276, 278, and 280, capacitor 282, and diode 284 connected as shown. The output of the peak detector 142 is fed into a comparitor 144 where it is compared with the output of the ramp circuitry 146. The comparitor is comprised of amplifier 286, resistors 288 and 290, and invertor 292 connected as shown. The ramp circuitry 146 is comprised of resistors 294, 296, 298, 300, 302, and 304 connected as shown.

Again referring to FIG. 6b, locking circuitry 148 is comprised of amplifier 306, resistors 308, 310, and 312, and diode 314 connected as shown. The non-inverting input of amplifier 306 is connected to microprocessor 132 at pin P35. Further, frequency divider 150, which is preferably model no. 4040 manufactured by Motorola, receives its input from the microprocessor 132. The microprocessor 132 uses the 12 MHz crystal 316 to develop, via an internal programmable counter, a frequency equal to the "center frequency" of the transmitter 22a (note that the transmitter 22a does not really have a "center frequency" but rather has $f_{high}$ and $f_{low}$ and the receiver is set in between these two frequencies). Therefore, when a transmitter 22a is selected, the microprocessor 132 programs its internal counter to develop the proper middle frequency.

Again referring to FIG. 6b, frequency divider 164 is preferably model no. 4569 manufactured by Motorola and is connected as shown. Further, phase locked loop 166 is comprised of, preferably, integrated circuit model no. 4046 322 manufactured by Motorola, resistors 324, 326, and 328, and capacitors 330 and 332 connected as shown. Also, comparitor 145 is comprised of amplifier 334 and resistor 336 connected as shown. The phase locked loop 166 and the frequency divider 164 multiply by fifty the frequency that the internal counter of the microprocessor 132 is outputting. This multiplied frequency is needed by filter means 126 to time itself to the correct transmitter 22a frequency.

Again referring to FIG. 6b, the power regulation means 122 of the power means is comprised of switch 338, integrated circuit model no. 7808 340 manufactured by Motorola, diodes 342, 344, and 346, resistors 348, 350, 352, and 354, amplifier 356, transistors 358 and 360, and capacitors 362 and 364 connected as shown. The outputs of the power means 112 provides all necessary voltages for the receiver means 24.

Again referring to FIG. 6b, mode selection circuitry 168 of selection circuitry 156 is comprised of a switch 366 and a resistor 368 connected as shown. Further, transmitter selection circuitry 170 is comprised of a switch 370 and a resistor 372 connected as shown. The operator of the circuit breaker tester 10 can selectively receive mode 1 frequencies (e.g., $f_{high}$ or $f_{low}$) or mode 2 (e.g., $f_{high}/4$ or $f_{low}/4$) frequencies of the transmitter 22a by toggling switch 366. Thus, if, for instance, the operator knows that the conductor 12a to be traced is connected to resistive load, the operator should select to receive mode 1 frequencies. However, if, for instance, the operator knows that the conductor 12a to be traced is connected to computer apparatus, the operator should select to receive mode 1 frequencies. Still further, the operator must decide, via transmitter selection circuitry 170, which of the six transmitters, 22a through 22f, the receiver means 24 should adjusted to receive. In a multiple transmitter circuit breaker tester 10, the operator can switch from receiving transmitter #1 to receiving transmitter #5 by depressing switch 370 four times. In order to switch from transmitter #5 to transmitter #1, the operator simply depresses switch 370 twice. The mode selection circuitry 168 and transmitter selection circuitry 170 help enable the operator to determine which transmitters 21a through 21f are connected to which electrical outlets 14a through 14f and trace each corresponding conductor, 12a through 12f, with a single trip to the circuit breaker box 18.

Again referring to FIG. 6b, audio indicator means 158 is comprised of inverters 374 and 376, diodes 378 and 380, transistor 382, resistors 384, 386, 388 and 390, capacitor 392, and buzzer 394 all connected as shown. This circuitry gives the operator an audio indication of when the signature signal 26a is detected. Further, coarse visual indicator means 160 is comprised of invertor 396, resistor 398, and LED 400 all connected as shown. This circuitry gives the operator a visual indication that the signature signal 26a has been detected by the device. Frequency dividers, 150, 164, and 130 are connected (but not to each other) within the circuit as shown). Also, the ROM 182, whose data is read by the microprocessor 132, is connected as shown. Lastly, latch 172 and LED drivers 174, 176, 178 are connected as shown (LED's 180 are not shown).

FIG. 5(b) and 6(b) described above, are, respectively, the block diagram and the schematic for the hardware of the multiple transmitter receiver unit. Below, there is a description of the software which the microprocessor 132 runs. However, before the software of FIG. 7 is described, there is a description of FIGS. 5a and 6a which correlate to the block diagram and the electrical schematic of the single transmitter receiver, respectively, which is another embodiment of the present invention.

Referring to FIG. 5a, receiver means 24 is comprised of power means 402, sensing means 404, processing means 406, and indicator means 408. Preferably, the sensing means 404 is comprised of a transducer 410. Also, the processing means 406 is preferably comprised of amplifier means 412, filter means 414, half wave rectifier 416, averaging circuitry 418 and 420, differential amplifier 422, comparitor 424, mode selection circuitry 426, oscillator 428, frequency divider 430 and 432, and audio indicator means 434 all connected as shown. The indicator means 408 is comprised of LED's and drivers 436, 438, and 440 connected as shown.

Figure 6A:
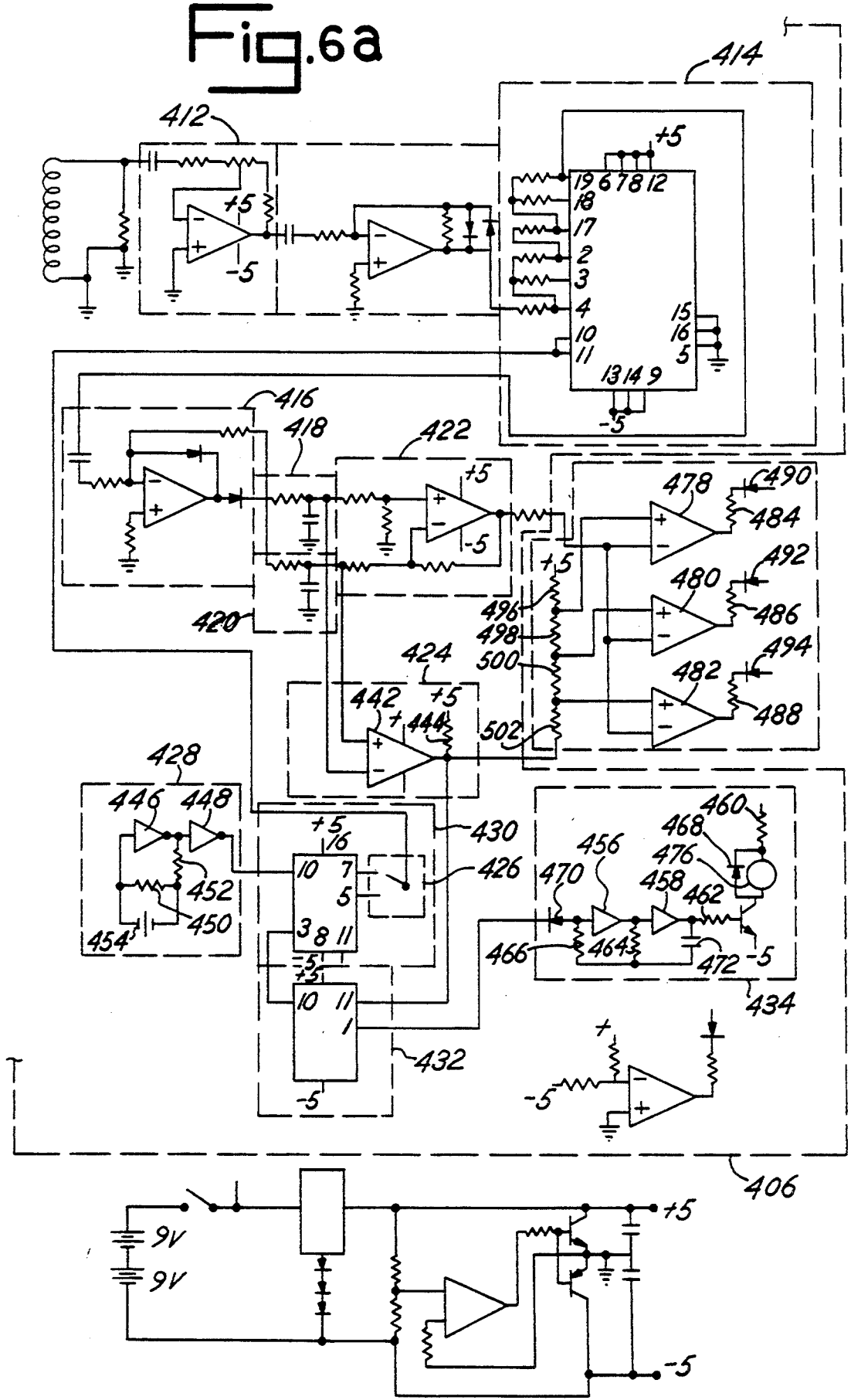
Figure 6B:
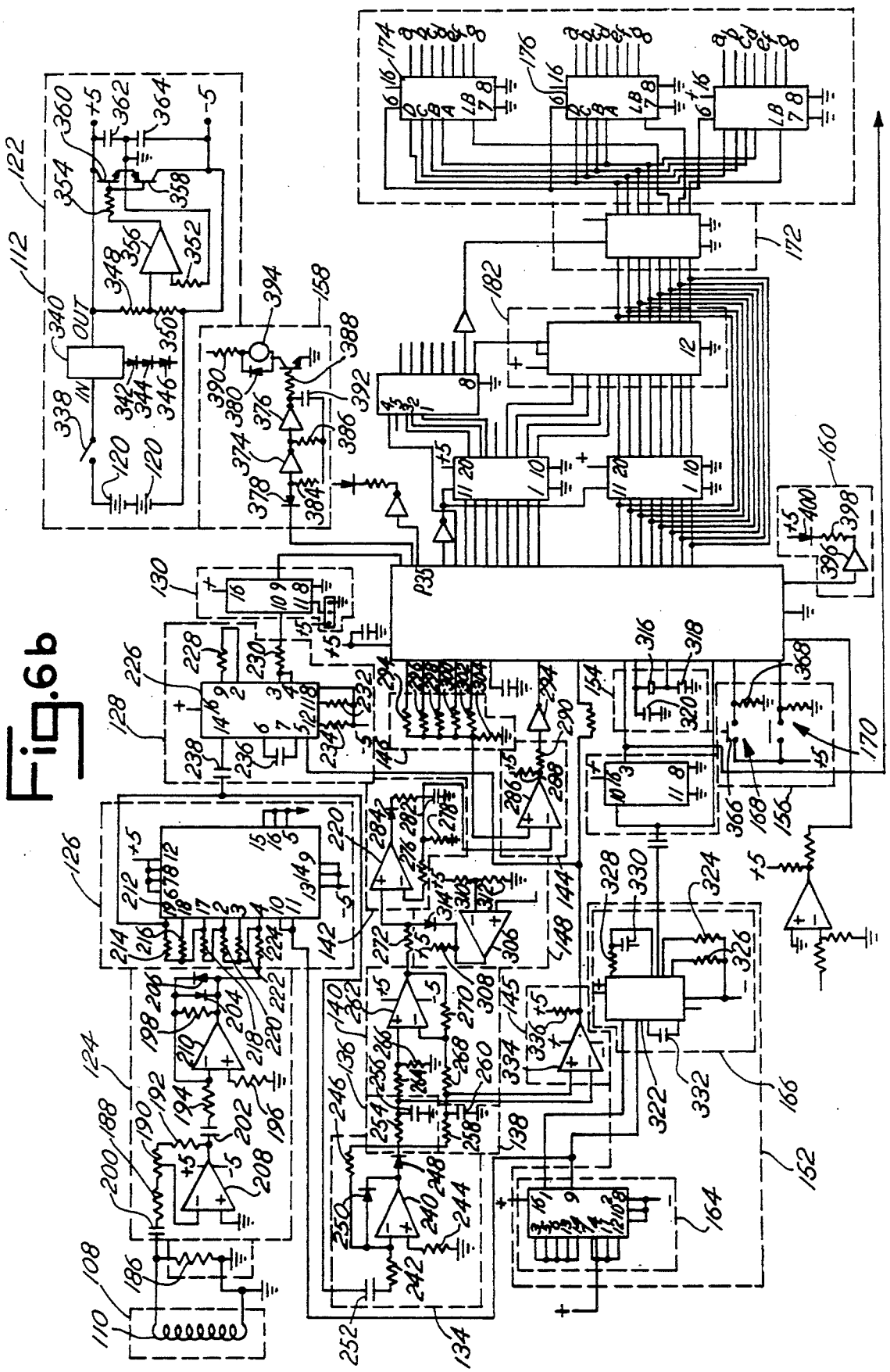
FIG. 6b is an electrical schematic diagram showing a preferred form of the receiver shown in FIG. 5b.
Figure 7A:
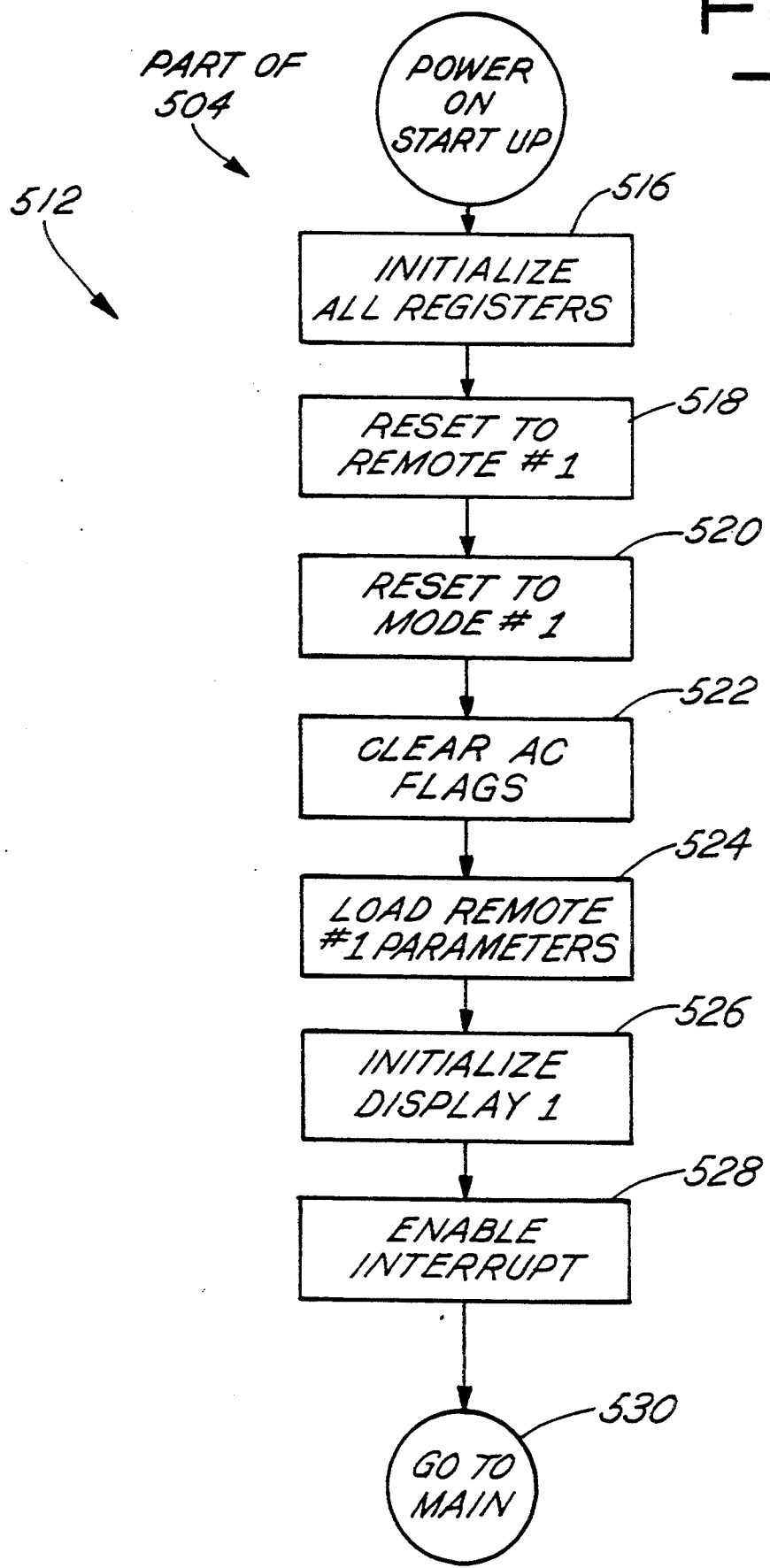
Figure 7B:
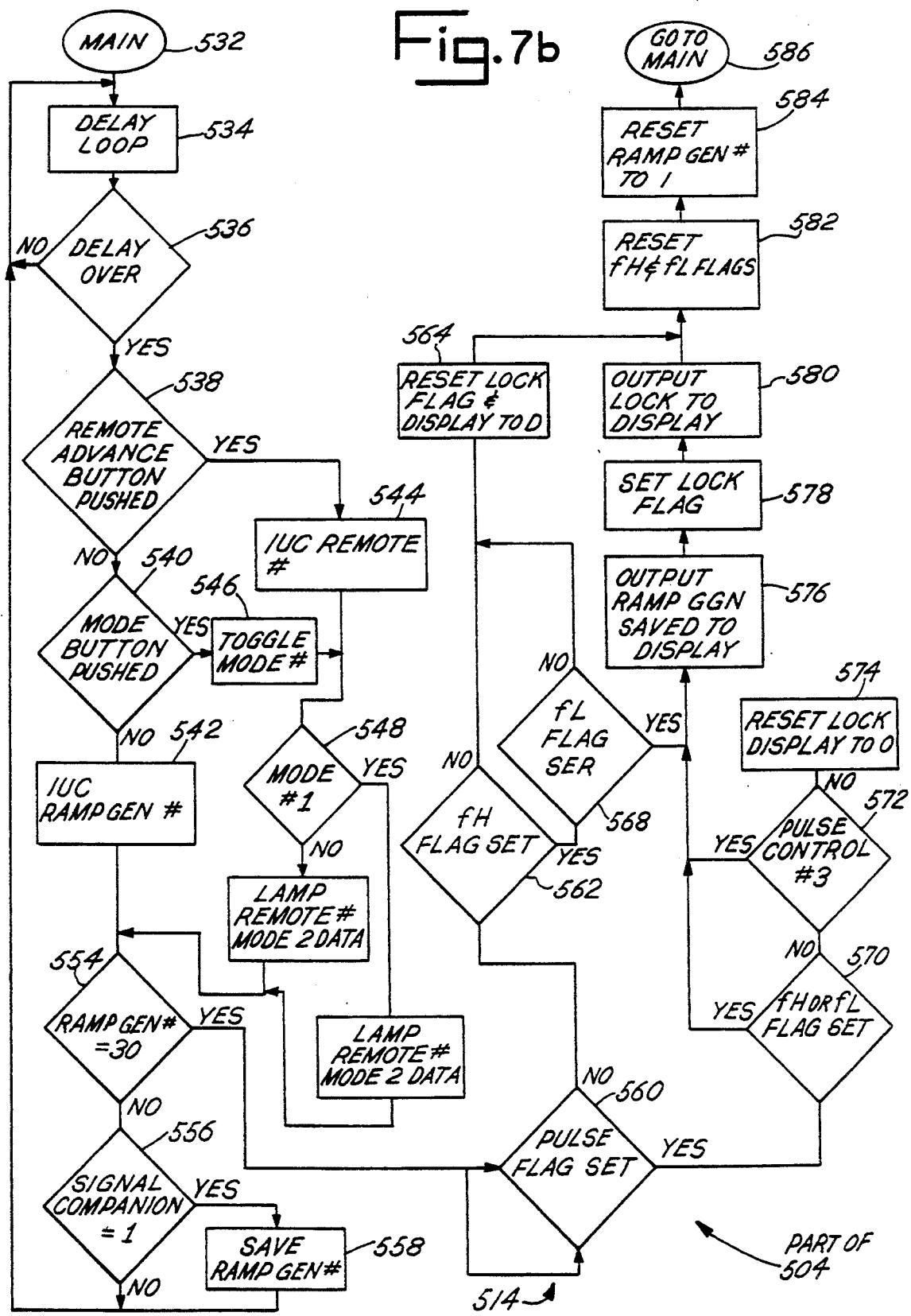
Figure 7C:
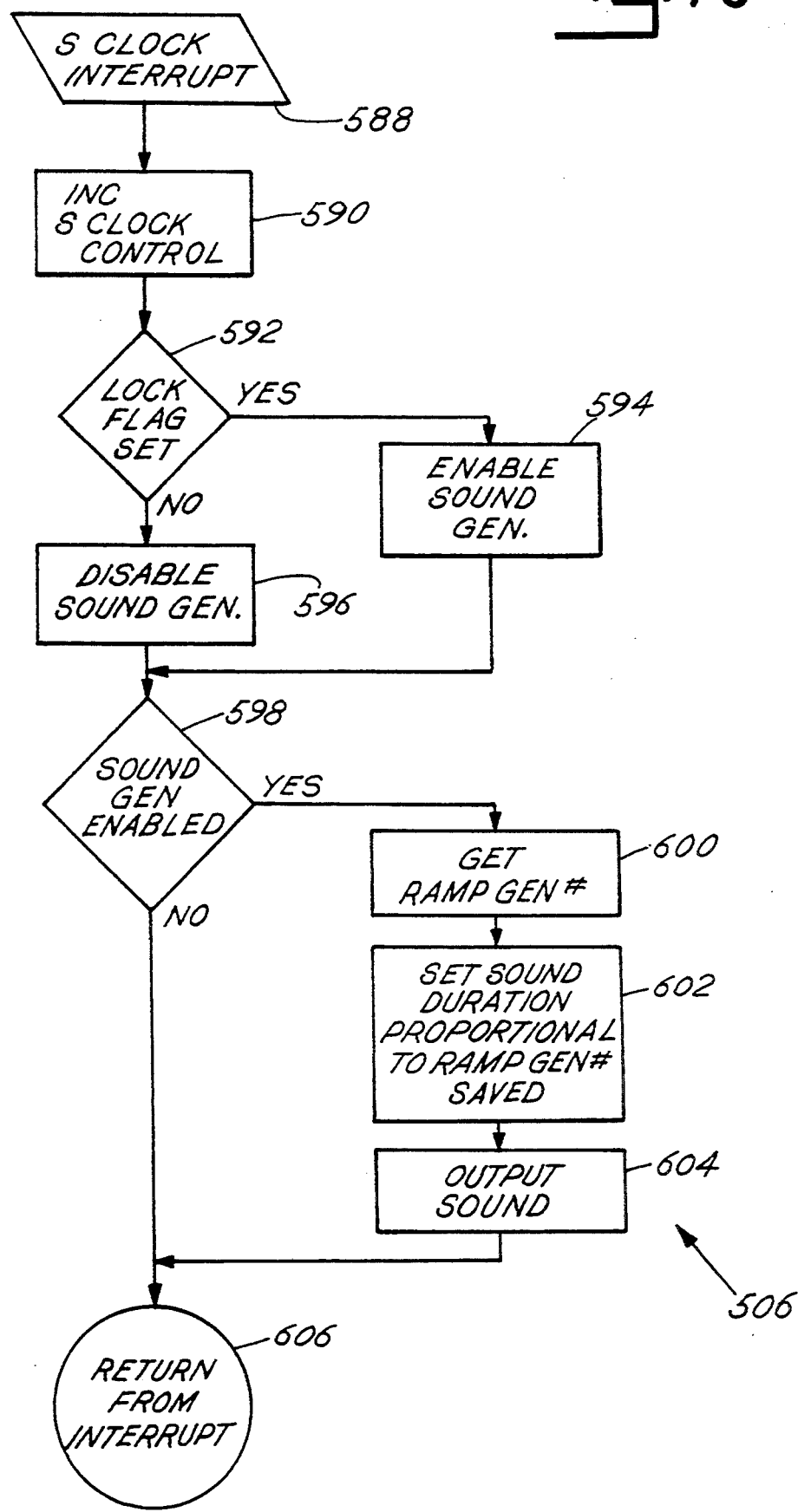
Figure 7E:
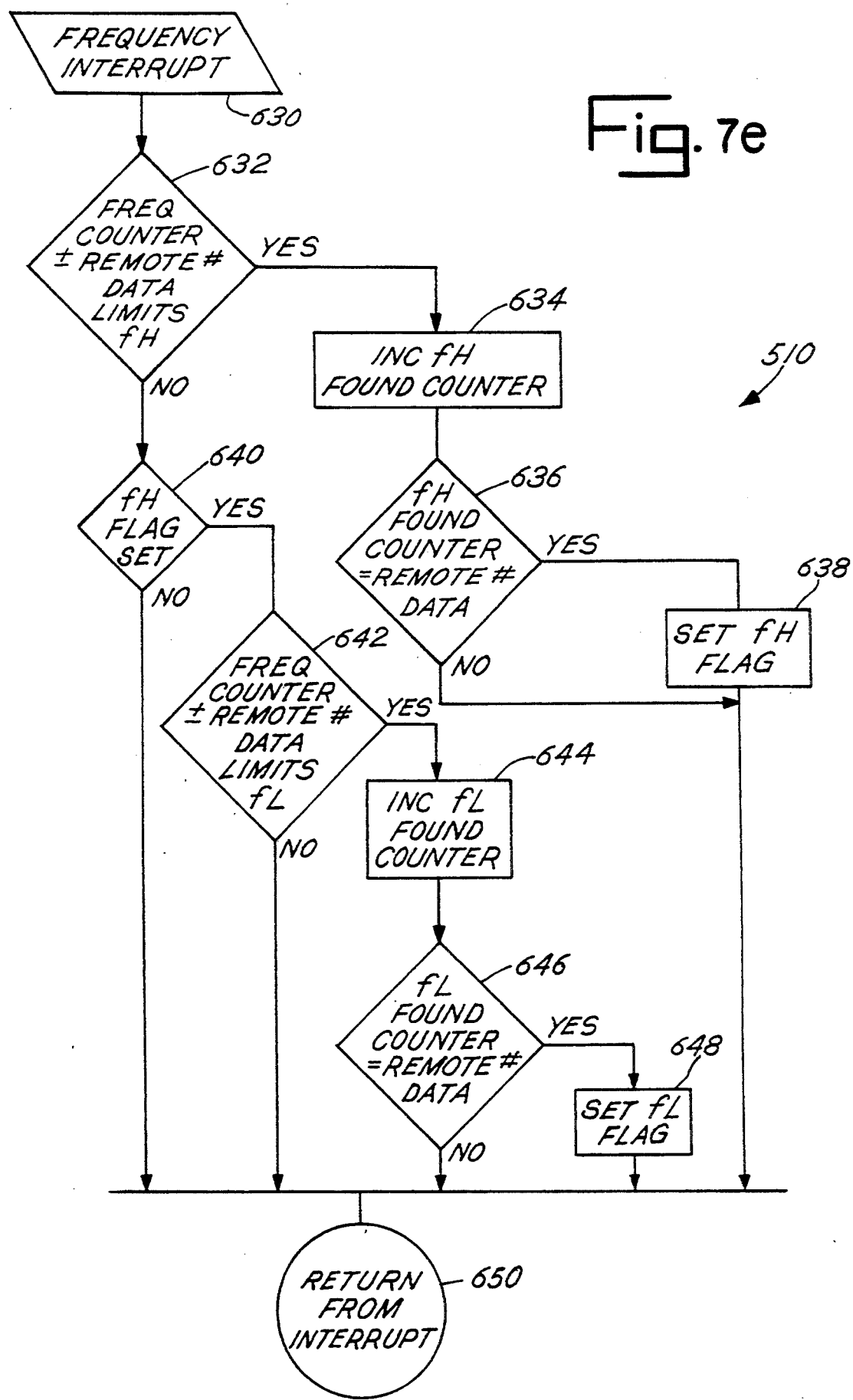

Referring to FIG. 6a, sensing means 404, amplifier 412, filter means 414, half wave rectifier 416, averaging circuitry 418 and 420, and differential amplifier 422 contain the same components connected in the same manner as described in reference to FIG. 6b's amplifier 124, filter means 126, half wave rectifier 134, averaging circuitry 136 and 138 and differential amplifier 149, respectively. Thus, these components will not be described again.

Again referring to FIG. 6, and more specifically to FIG. 6b, comparitor 424 is comprised of a comparitor 442 and a resistor 444 connected as shown. Further, mode selection circuitry 426 and frequency divider 430 are connected as shown. Further, oscillator 428 is comprised of inverters 446 and 448, resistors 450 and 452, and crystal 454 connected as shown. Lastly, audio indicator means 434 is comprised of inverters 456 and 458, resistors 460, 462, 464 and 466, diodes 468 and 470, capacitor 472, transistor 474, and buzzer 476 all connected as shown.

Again referring to FIG. 6a, indicator means 408 is comprised of drivers 478, 480 and 482, resistors 484, 486 and 488, and LED's 490, 492 and 494 all connected as shown. Also, this circuitry contains resistors 496, 498, 500, and 502.

Referring to FIG. 7, the software program 184 (contained in ROM 182—see FIG. 5b) necessary for the multiple transmitter embodiment of the present invention is comprised of an interrupt driven main program 504, a first interrupt routine 506, a second interrupt routine 508, and a third interrupt routine 510. The main program 504 is further comprised a power up routine 512, and a main routine 514. Once the power up routine 512 has been completed, the main routine 514 is continually executed by the microprocessor 132 until one of the three interrupt, routines (506, 508, or 510) occurs. The interrupts, in an individual sense, occur in a synchronous fashion.

Again referring to FIG. 7, the main routine 514, consists of even numbered function blocks 532 through 586, inclusive, connected as shown in FIG. 7.

The main routine 514 make use of a ramp generator, which essentially is comprised of ramp circuitry 146 and comparitor 144 (See FIG. 6b). The main routine 514 determines when the inverting input of comparitor 144 is exceeded by the value of the ramp circuitry 146, which is output to the non-inverting input of the comparitor 144. The ramp circuitry 146 generates a ramp in thirty discrete steps, although the input to the comparitor 144 is an analog signal. The pin P-27 of the microprocessor goes from zero or a low state (zero volts) to one or a high state (five volts) when the voltage input from the ramp circuitry 146 exceeds the voltage on the inverting terminal of the comparitor 144. This completes the description of even-numbered blocks 534–558 of the main routine 514.

Even-numbered blocks 560–586 of the main routine 514, essentially serve to output the saved value of the ramp generator number as saved in block number 558, and reset flag values. Further, these even numbered blocks generate the signal strength of the detected transmitter signal and output this signal strength signal on lines P-10 through P-17 of the microprocessor 132.

Although the three interrupt routines 506, 508, and 510 occur, individually, in a synchronous fashion, they occur asynchronously with respect to one another. When the main routine receives an interrupt, the interrupt is immediately serviced and upon completion, the main routing 514 is continued.

The first interrupt routine 506 has two functions. First, it functions to enable sound generation and pulse timing. Second, it varies the pulse rate of the sound depending upon the proximity of the receiver to the conductor carrying the desired signature signal. In other words, the closer the receiver is to the conductor, the quicker the bursts of sound will occur to notify the operator. Output line P-36 of the micro-processor 132 contains the center frequency of the desired transmitter. This center frequency is divided by 32 via frequency divider 150 and input back into the microprocessor 132 via line P-33. Thus, the first interrupt routine 506 occurs one time for every 32 cycles of the center frequency of the desired transmitter. It should be noted that the first interrupt routine 506 only functions when the lock flag is set. See block 578 of the main routine 514.

The second interrupt routine 508 essentially determines the time or period needed for one cycle of the mode 1/mode 2 square-wave. Interrupt No. 2 only functions if the S-clock counter is greater than or equal to thirty. See block 610. The S-clock counter is incremented via block 590 of interrupt routine No. 1 506. The second interrupt routine 508 is serviced via line P-30 of microprocessor 132.

The third interrupt routine 510 is used in conjunction with filter means 126, phase lock loop 128, and frequency divider 130, in addition to line P-31 of microprocessor 132. This third interrupt essentially looks at $f_{high}$ and $f_{low}$ as passed through the filter means 126 and eventually divided by two via the frequency divider 130. This frequency is input into the microprocessor 132 via line P-31. The $f_{high}$ and $f_{low}$ used by the third interrupt routine 510 relate to the frequency that the operator chooses for the receiver to pick up (i.e. it depends on which transmitter the operator is seeking to identify the location of).

While the above serves to describe the invention, the scope of the invention is determined by the appended claims.

What is claimed is:

1. A testing apparatus for identifying a particular conductor among a plurality of conductors, each of said conductors carrying a non-zero voltage and being electrically connected to both an electrical outlet and a common circuit breaker box, comprising, in combination:

a plurality of transmitters, each one of said transmitters transmitting an analog signature signal corresponding to said one of said transmitters and each of said analog signature signals having a different frequency, each of said transmitters further being electrically connectable to said electrical outlets and conductors; and a receiver for detecting said analog signature signal corresponding to said one of said transmitters and responsively indicating detection of said analog signature signal, whereby said receiver may be placed in proximity to said conductors at a location remote from said transmitters and indicate which of said electrical conductors is interconnected to said one of said transmitters, even when more than one transmitter is interconnected to a single electrical conductor.

2. An apparatus as claimed in claim 1 wherein each of said transmitters further comprises:

means for generating an oscillating signal of a preselected frequency, said oscillating signal having a first cycle and a second cycle;

means for dividing both said first and second cycles of said preselected frequency of oscillating signal into four quarter cycles, said means for dividing electrically connected to said means for generating;

means for cycle selection electrically connected to said means for dividing;

logic circuitry electrically connected to said means for cycle selection, an output signal of said logic circuitry comprising at least four different frequencies; and output means electrically connected to said logic circuitry.

3. An apparatus as claimed in claim 1 wherein said receiver further comprises:

sensing means for detecting said analog signature signal corresponding to said one of said transmitters;

processing means for processing said detected preselected analog signature signal, said processing means being electrically connected to said sensing means; and indicator means for exhibiting the presence and strength of said preselected analog signature signal of said one of said transmitters, said indicator means being electrically connected to said processing means.

4. An apparatus as claimed in claim 1 wherein each of said analog signature signals includes both voltage and current components and each said transmitter includes shifting means for phase shifting said current component of said analog signature signal with respect to said voltage component of said analog signature signal, whereby power requirements of said apparatus may be reduced.

* * * * *